US012764866B2

(12) United States Patent
Hayasaka

(10) Patent No.: US 12,764,866 B2
(45) Date of Patent: Oct. 13, 2026

(54) MOUNTING BOARD

(71) Applicant: Panasonic Automotive Systems Co., Ltd., Kanagawa (JP)

(72) Inventor: Mitsunori Hayasaka, Kanagawa (JP)

(73) Assignee: PANASONIC AUTOMOTIVE SYSTEMS CO., LTD., Kanagawa (JP)

(*) Notice: Subject to any disclaimer, the term of this patent is extended or adjusted under 35 U.S.C. 154(b) by 197 days.

(21) Appl. No.: 18/740,065

(22) Filed: Jun. 11, 2024

(65) Prior Publication Data

US 2024/0334607 A1 Oct. 3, 2024

Related U.S. Application Data

(63) Continuation of application No. PCT/JP2022/026945, filed on Jul. 7, 2022.

(30) Foreign Application Priority Data

Dec. 17, 2021 (JP) ................................ 2021-205292

(51) Int. Cl.

| | |
|---|---|
| ***H05K 1/18*** | (2026.01) |
| ***H05K 1/02*** | (2006.01) |
| ***H05K 1/181*** | (2026.01) |
| ***H10W 70/68*** | (2026.01) |

(52) U.S. Cl.

CPC ........... *H05K 1/181* (2013.01); *H05K 1/0298* (2013.01); *H10W 70/68* (2026.01); *H05K 2201/09227* (2013.01)

(58) Field of Classification Search

CPC ........ H05K 1/18; H05K 1/181; H05K 1/0298; H05K 2201/09072; H05K 2201/09227; H05K 2203/1178; H10W 70/68

See application file for complete search history.

(56) References Cited

U.S. PATENT DOCUMENTS 6,153,939 A * 11/2000 Wang .................. H10W 74/012 257/734
6,815,830 B2 * 11/2004 Miyasaka ........... H10W 74/012 438/109
2007/0215927 A1 9/2007 Kuramochi
(Continued)

FOREIGN PATENT DOCUMENTS

CN 211481596 U 9/2020
JP H01-139429 U 9/1989
(Continued)

OTHER PUBLICATIONS

ISR issued in International Patent Application No. PCT/JP2022/026945, Sep. 27, 2022, translation.
(Continued)

*Primary Examiner* — Roshn K Varghese
(74) *Attorney, Agent, or Firm* — GREENBLUM & BERNSTEIN, P.L.C.

(57) ABSTRACT

There is provided a mounting board including: a printed board; an electronic component surface-mounted on the printed board; and a resin for a sidefill applied to an outer periphery of the electronic component. At least one of the printed board and the electronic component includes a through-hole connected to a space defined by the printed board, the electronic component, and the resin for the sidefill.

12 Claims, 12 Drawing Sheets

(56) References Cited

U.S. PATENT DOCUMENTS

| | | | | |
|---|---|---|---|---|
| 2008/0150159 | A1* | 6/2008 | Aberin | H10W 74/012 257/E21.503 |
| 2012/0149150 | A1* | 6/2012 | Toh | H10W 90/00 438/667 |
| 2020/0286746 | A1 | 9/2020 | Ok et al. | |

FOREIGN PATENT DOCUMENTS

| | | | |
|---|---|---|---|
| JP | 2002-118208 | A | 4/2002 |
| JP | 2003-158215 | A | 5/2003 |
| JP | 2006-165324 | A | 6/2006 |
| JP | 2007-251070 | A | 9/2007 |
| JP | 2007-294542 | A | 11/2007 |
| JP | 2011-129680 | A | 6/2011 |
| JP | 2016-048752 | A | 4/2016 |

OTHER PUBLICATIONS

IPRP issued in International Patent Application No. PCT/JP2022/026945, Jun. 13, 2024, translation.

* cited by examiner

MOUNTING BOARD

CROSS-REFERENCE TO RELATED APPLICATIONS

The present application is a continuation application of PCT/JP2022/026945 that claims priority to Japanese Patent Application No. 2021-205292 filed on Dec. 17, 2021, the entire content of which is incorporated herein by reference.

TECHNICAL FIELD

The present disclosure relates to a mounting board.

BACKGROUND ART

JP2002-118208A describes a method of reinforcing connection of a semiconductor component to a board using a sidefill for applying a resin to a periphery of the semiconductor component, instead of an underfill for applying a resin to a gap between a surface of the board and a lower surface of the semiconductor component, in order to flip-chip mount the semiconductor component on the board.

In a case where a sidefill for applying a resin to a periphery of an electronic component is applied, a space of the gap between the surface of the board and the lower surface of the electronic component is sealed by the resin used for the sidefill. Therefore, for example, when heating is performed to cure the resin of the sidefill, air or moisture in the sealed space may expand to form a hole in the resin of the sidefill.

SUMMARY OF INVENTION

The present disclosure provides a mounting board which can avoid an opening of a hole in a resin used for a sidefill on the mounting board.

According to an illustrative aspect of the present disclosure, a mounting board includes: a printed board; an electronic component surface-mounted on the printed board; and a resin for a sidefill applied to an outer periphery of the electronic component. At least one of the printed board and the electronic component includes a through-hole connected to a space defined by the printed board, the electronic component, and the resin for the sidefill.

According to the present disclosure, it is possible to avoid an opening of a hole in a resin used for the sidefill on the mounting board.

DESCRIPTION OF EMBODIMENTS

Hereinafter, an embodiment of the present disclosure will be described in detail with reference to the drawings as appropriate. However, more detailed description than necessary may be omitted. For example, detailed description of already well-known matters and redundant description of substantially the same configuration may be omitted. This is to avoid unnecessary redundancy of the following description and to facilitate understanding of those skilled in the art. The accompanying drawings and the following description are provided for those skilled in the art to sufficiently understand the present disclosure, and are not intended to limit the subject matter described in claims.

Present Embodiment

Figure 1:
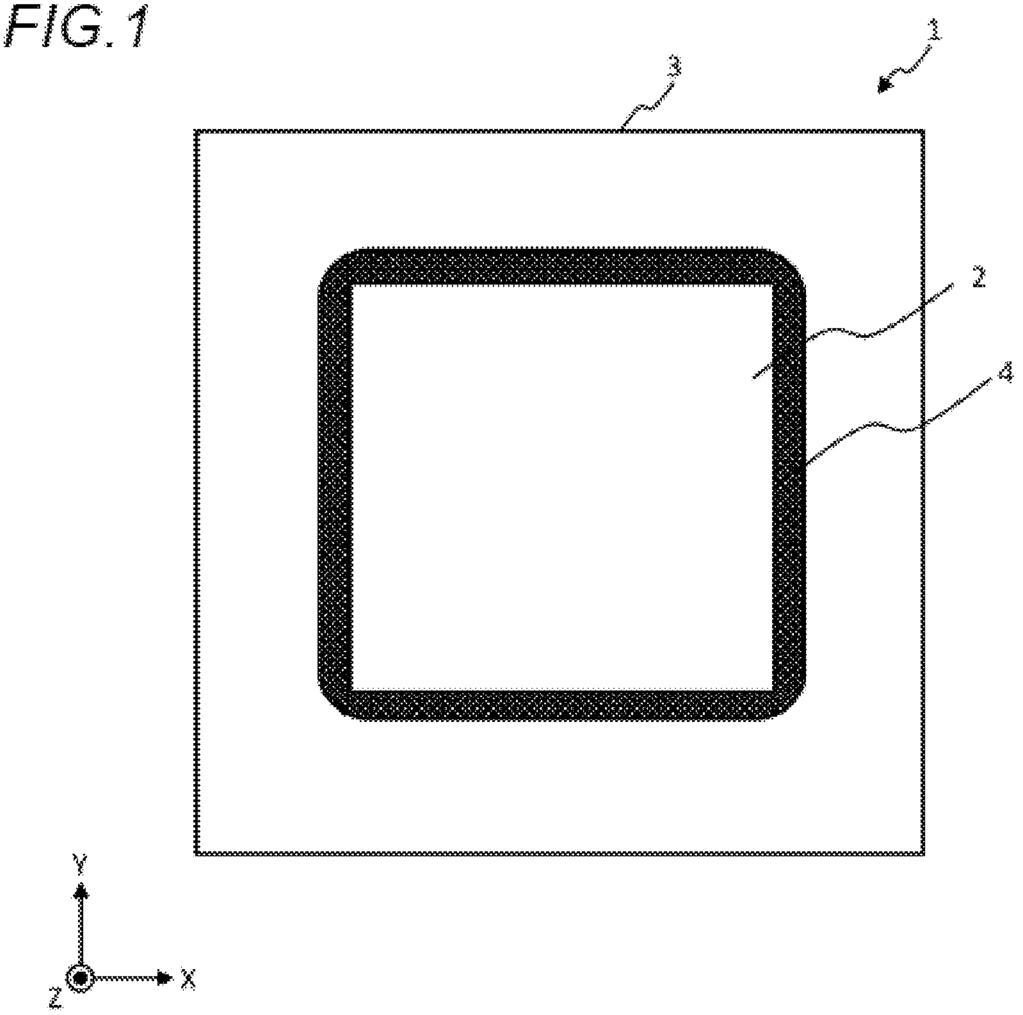
FIG. 1 is a plan view showing an example of a mounting board in which a sidefill is applied to a periphery of an electronic component.
Figure 2:
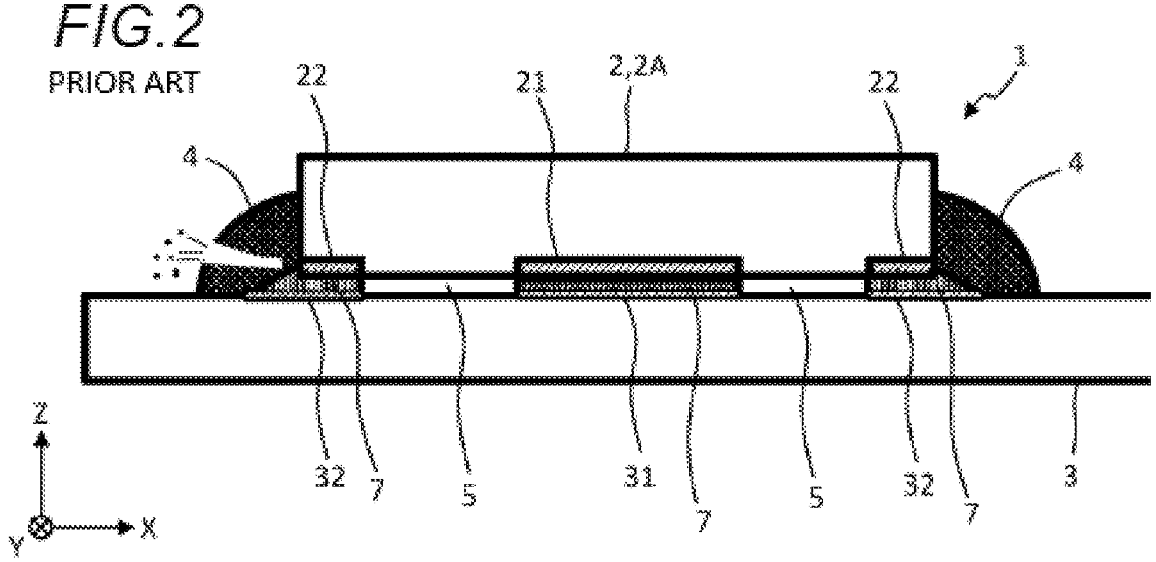
FIG. 2 PRIOR ART
FIG. 2 is a cross-sectional view showing an example of a mounting board in which the sidefill is applied to a periphery of a quad flat non leaded package (QFN).
Figure 3:
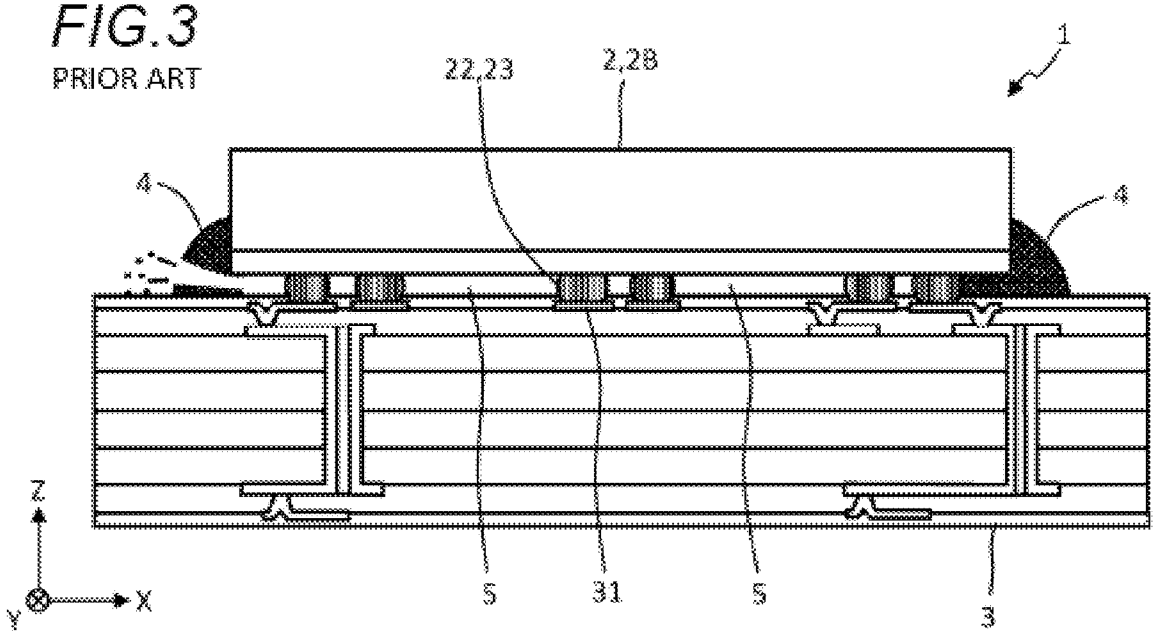
FIG.3 PRIOR ART
FIG. 3 is a cross-sectional view showing an example of a mounting board in which the sidefill is applied to a periphery of a ball grid array (BGA).

FIG. 1 is a plan view showing an example of a mounting board 1 in which the sidefill is applied to a periphery of an electronic component 2. FIG. 2 is a cross-sectional view showing an example of the mounting board 1 in which the sidefill is applied to a periphery of a quad flat non-leaded package (QFN) 2A. FIG. 3 is a cross-sectional view showing an example of the mounting board 1 in which the sidefill is applied to a periphery of a ball grid array (BGA) 2B.

For convenience of description, in the present embodiment, as shown in FIGS. 1,2, and 3, axes parallel to surfaces of a printed board 3 are defined as an X-axis and a Y-axis, and an axis perpendicular to a surface of the printed board 3 is defined as a Z-axis. For convenience of description, a positive direction of the Z-axis may be referred to as "up", and a negative direction of the Z-axis may be referred to as "down". The expressions related to these directions are used for convenience of explanation, and are not intended to limit a posture of the structure in actual use.

The plan view (plane view) shown in FIG. 1 corresponds to a view showing an XY plane, and the cross-sectional views shown in FIGS. 2 and 3 correspond to views showing a ZX plane.

The mounting board 1 includes the printed board 3 and the electronic component 2 that is surface-mounted on the printed board 3. Examples of the electronic component 2 include a QFN 2A (see FIG. 2) and a BGA 2B (see FIG. 3). However, the electronic component 2 is not limited thereto, and may be a chip size package (CSP), a land grid array (LGA), a quad flat package (QFP), or the like. The electronic component 2 may be read as another term such as a semiconductor device, a semiconductor package, or a surface-mounted package.

When the mounting board 1 is manufactured, the electronic component 2 is joined to the printed board 3 by solder. However, as in the case of a vehicle (for example, an automobile, a motorcycle, a tractor, a ship, an aircraft, a railway, or a bicycle), the mounting board 1 used in an environment in which vibrations and/or temperature changes are severe may cause a crack or the like in a solder (hereinafter, referred to as a solder joint 7) that joins the electronic component 2 to the printed board 3.

Therefore, when the mounting board 1 is manufactured, a technique called sidefill is used in which a resin having a relatively high viscosity (hereinafter, referred to as a reinforcing resin 4) is applied to a periphery of the electronic component 2 and heated to cure the reinforcing resin 4, thereby more firmly fixing the electronic component 2 to the printed board 3. By applying the sidefill, the electronic component 2 can be more firmly fixed to the printed board 3 as described above. In addition, by applying the sidefill, a space of a gap between an upper surface of the printed board 3 and a lower surface of the electronic component 2 is sealed, thereby improving security performance and tamper resistance. In the following description, a space of a gap formed by the electronic component 2, the printed board 3, and the reinforcing resin 4 used for the sidefill is referred to as an under-component space 5.

In the sidefill, heating of about 100° C. to 150° C. is performed to cure the reinforcing resin 4, and at this time, air and moisture sealed in the under-component space 5 may expand to form a hole in a portion of the reinforcing resin 4. In addition, when the air and moisture in the under-component space 5 expand and break and eject the reinforcing resin 4, flux residues contained in the reinforcing resin 4 may diffuse on the printed board 3. The flux residues cause poor quality of the mounting board 1.

In the mounting board 1 mounted on a vehicle or the like, the air and moisture in the under-component space 5 repeatedly expand and contract due to a temperature change caused by heat generation during an operation of the electronic component 2. The expansion and contraction of the air in the under-component space 5 damage the solder joint 7.

Therefore, in the present embodiment, a configuration of the mounting board 1 for avoiding an opening of a hole in the reinforcing resin 4 used for the sidefill will be described.

Figure 4:
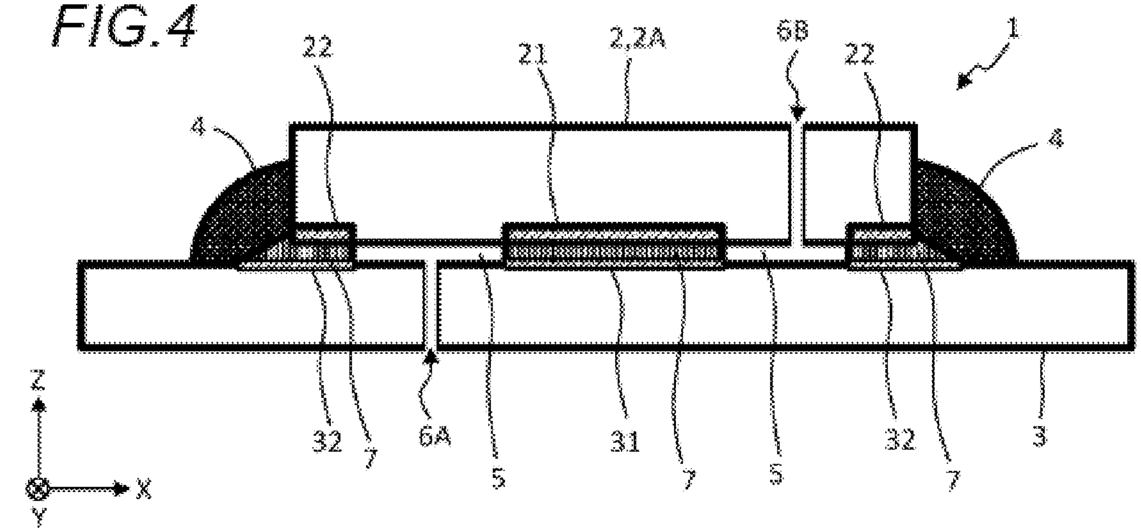
FIG. 4 is a cross-sectional view showing an example in which a through-hole is provided in the mounting board in which the sidefill is applied to a periphery of the QFN package according to the present embodiment.
Figure 5:
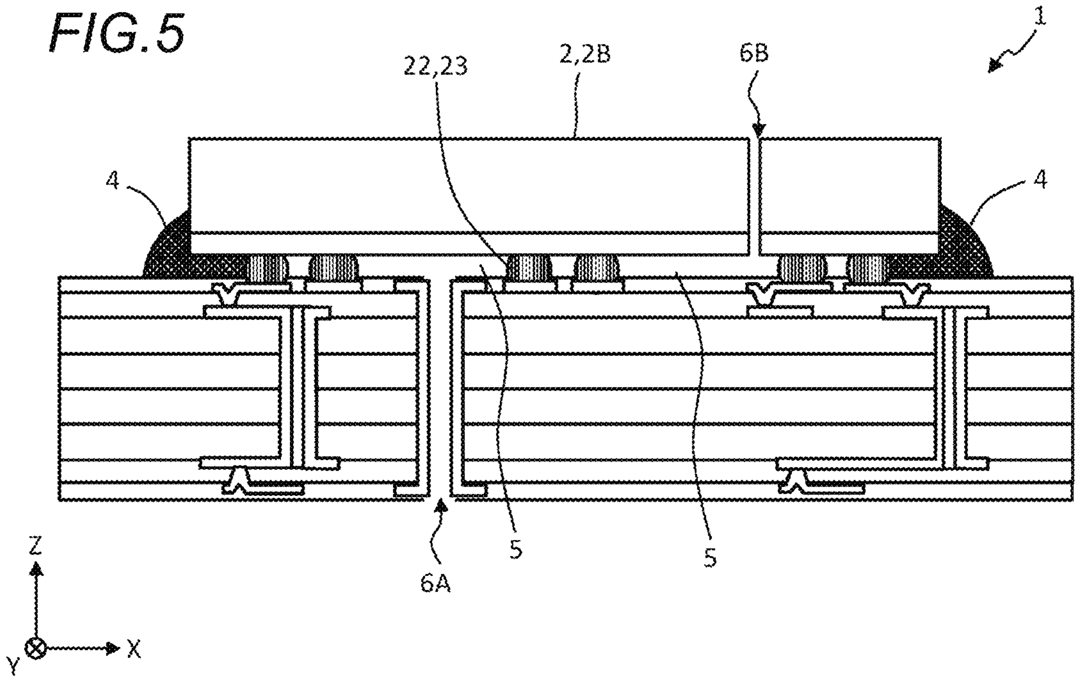
FIG. 5 is a cross-sectional view showing an example in which a through-hole is provided in the mounting board to which the sidefill is applied to the periphery of the BGA according to the present embodiment.

FIG. 4 is a cross-sectional view showing an example in which a through-hole is provided in the mounting board 1 in which the sidefill is applied to a periphery of the QFN 2A according to the present embodiment. FIG. 5 is a cross-sectional view showing an example in which a through-hole is provided in the mounting board 1 in which the sidefill is applied to a periphery of the BGA 2B according to the present embodiment. The cross-sectional views shown in FIGS. 4 and 5 correspond to the views of the ZX plane.

As shown in FIGS. 4 and 5, the mounting board 1 is provided with a through-hole 6 connected to the under-component space 5 formed by the electronic component 2, the printed board 3, and the reinforcing resin 4 used for the sidefill in at least one of the printed board 3 and the electronic component 2. One or more through-holes 6 may be provided only in the printed board 3, one or more through-holes 6 may be provided only in the electronic component 2, or one or more through-holes 6 may be provided in each of the printed board 3 and the electronic component 2.

Accordingly, the air and moisture in the under-component space 5 can enter and exit through the through-hole 6, and even if the air and moisture in the under-component space 5 expand due to heating, no hole is formed in the reinforcing resin 4 used for the sidefill. Hereinafter, the through-hole 6 provided in the printed board 3 may be referred to as a board through-hole 6A, and the through-hole 6 provided in the electronic component 2 may be referred to as a component through-hole 6B. A diameter of the through-hole 6 may be 0.3 mm or more. Alternatively, the diameter of the through-hole 6 may be smaller than 0.3 mm. A diameter of the board through-hole 6A and a diameter of the component through-hole 6B may be the same or different from each other.

The through-hole 6 may be provided at a position different from a position where the solder joint 7 exists (that is, avoiding the solder joint 7). Accordingly, for example, it is possible to prevent the solder melted by reflow from blocking the through-hole 6.

The through-hole 6 may be provided at a position inside a region where the reinforcing resin 4 used for the sidefill enters the under-component space 5. For example, when the electronic component 2 is a BGA 2B, a CSP, or a LGA, the through-hole 6 may be provided inside connection terminals 22 (for example, solder balls 23) existing at an outermost periphery of the electronic component 2. For example, when the electronic component 2 is a QFN 2A, the through-hole 6 may be provided inside the connection terminals 22 existing at the outer periphery of the electronic component 2. Since the reinforcing resin 4 used for the sidefill has a viscosity higher than that of a resin used for an underfill, the reinforcing resin 4 used for the sidefill does not enter the under-component space 5 much as compared with the reinforcing resin 4 used for the underfill. Accordingly, the reinforcing resin 4 used for the sidefill entering the under-component space 5 does not reach the through-hole 6 provided at the above-described position, and does not block the through-hole 6.

A plurality of through-holes 6 may be provided. Accordingly, even if one through-hole 6 is temporarily closed by the reinforcing resin 4 used for the sidefill, air and moisture in the under-component space 5 can enter and exit through the other non-closed through-holes 6.

The solder resist on the printed board 3 may not be provided on the board through-hole 6A. Accordingly, it is possible to prevent the solder resist from blocking the board through-hole 6A.

An inner surface of the board through-hole 6A may be plated. Accordingly, the flux residues are easily discharged through the through-hole 6. Alternatively, the inner surface of the board through-hole 6A may not be plated. Accordingly, the solder can be prevented from adhering to an inner surface of the through-hole 6.

Next, several examples in which the through-hole 6 is provided in the mounting board 1 will be described.

Figure 6:
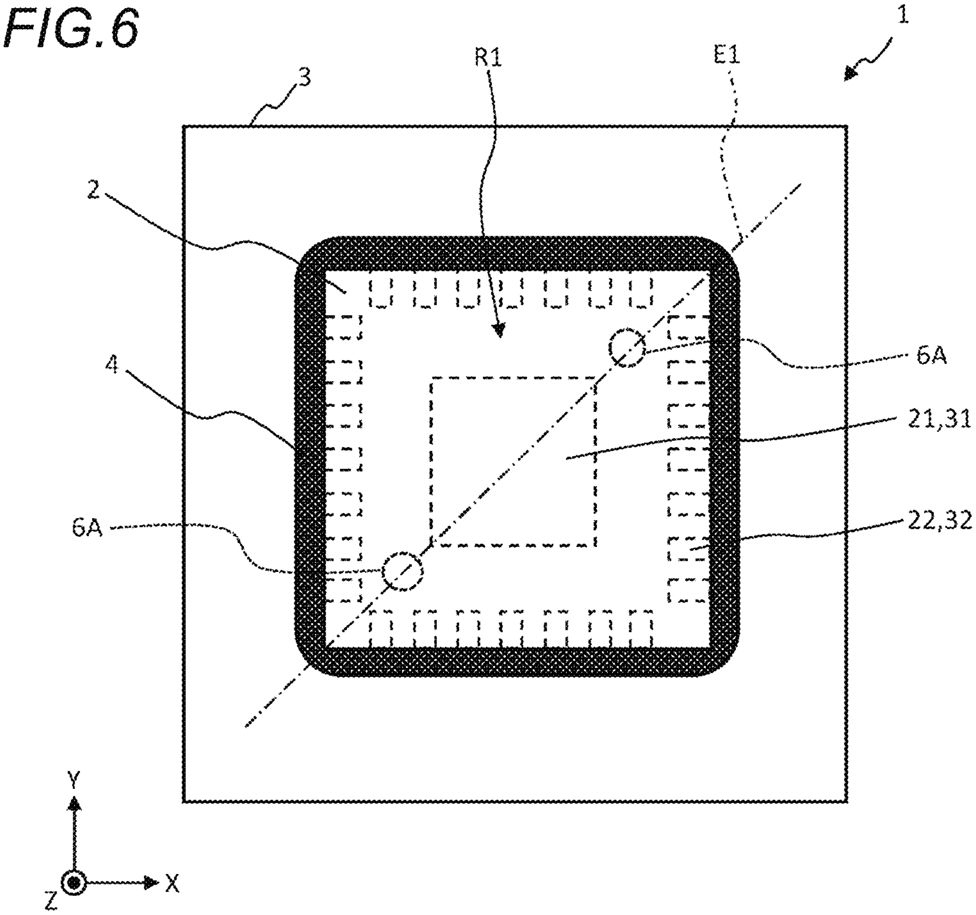
FIG. 6 is a plan view showing an example in which board through-holes are provided in a printed board in the mounting board including the QFN according to the present embodiment.

FIG. 6 is a plan view showing an example in which the board through-holes 6A are provided in the printed board 3 in the mounting board 1 including the QFN 2A according to the present embodiment.

As shown in FIG. 6, the QFN 2A includes a rectangular GND terminal 21 in a central portion and a plurality of connection terminals 22 in an outer periphery portion. The printed board 3 includes a GND land 31 to which the GND terminal 21 is joined and a land 32 to which the connection terminal 22 is joined in a portion where the QFN 2A is mounted. The GND terminal 21 is joined to the GND land 31 by solder. The connection terminals 22 are joined to the lands 32 by solder.

The board through-hole 6A may be provided in a region (hereinafter, referred to as a non-land region) R1 between the GND land 31 and the land 32.

Two board through-holes 6A may be provided with the GND land 31 interposed therebetween. For example, as shown in FIG. 6, two board through-holes 6A may be provided at positions on an extension of a diagonal line E1 of the GND land 31 with the GND land 31 interposed therebetween.

Accordingly, the two board through-holes 6A are disposed sufficiently apart from each other, so that both the two board through-holes 6A can be prevented from being blocked by the reinforcing resin 4 used for the sidefill. The number of the board through-holes 6A is not limited to two, and may be one or three or more.

Figure 7:
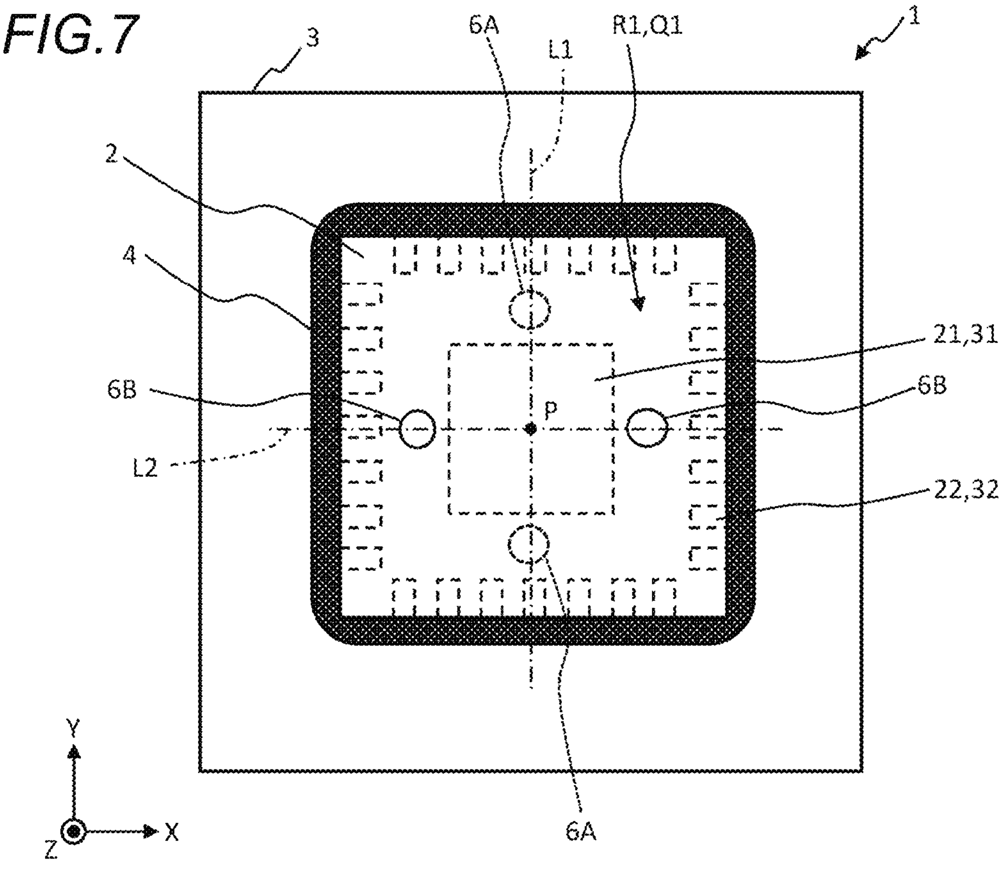
FIG. 7 is a plan view showing an example in which the board through-holes are provided in the printed board and component through-holes are provided in the QFN in the mounting board including the QFN according to the present embodiment.

FIG. 7 is a plan view showing an example in which the board through-holes 6A are provided in the printed board 3 and the component through-hole 6B are provided in the QFN 2A in the mounting board 1 including the QFN 2A according to the present embodiment.

Two board through-holes 6A may be provided in the non-land region R1 of the printed board 3 with the GND land 31 interposed therebetween. For example, two board through-holes 6A may be provided at positions on a first line L1 passing through a center point P of the GND land 31 and orthogonal to one side of the GND land 31 with the GND land 31 interposed therebetween. The number of the board through-holes 6A is not limited to two, and may be one or three or more.

Two component through-holes 6B may be provided across the GND terminal 21 in a region (hereinafter referred to as a non-contact region Q1) Q1 of the QFN 2A facing the non-land region R1. For example, two component through-holes 6B may be provided at positions on a second line L2 passing through a center point P of the GND terminal 21 and orthogonal to the first line L1 with the GND terminal 21 interposed therebetween. The number of component through-holes 6B is not limited to two, and may be one or three or more.

Accordingly, since the two board through-holes 6A and the two component through-holes 6B are disposed sufficiently apart from each other, so that all of the two board through-holes 6A and the two component through-holes 6B can be prevented from being blocked by the reinforcing resin 4 used for the sidefill.

Figure 8:
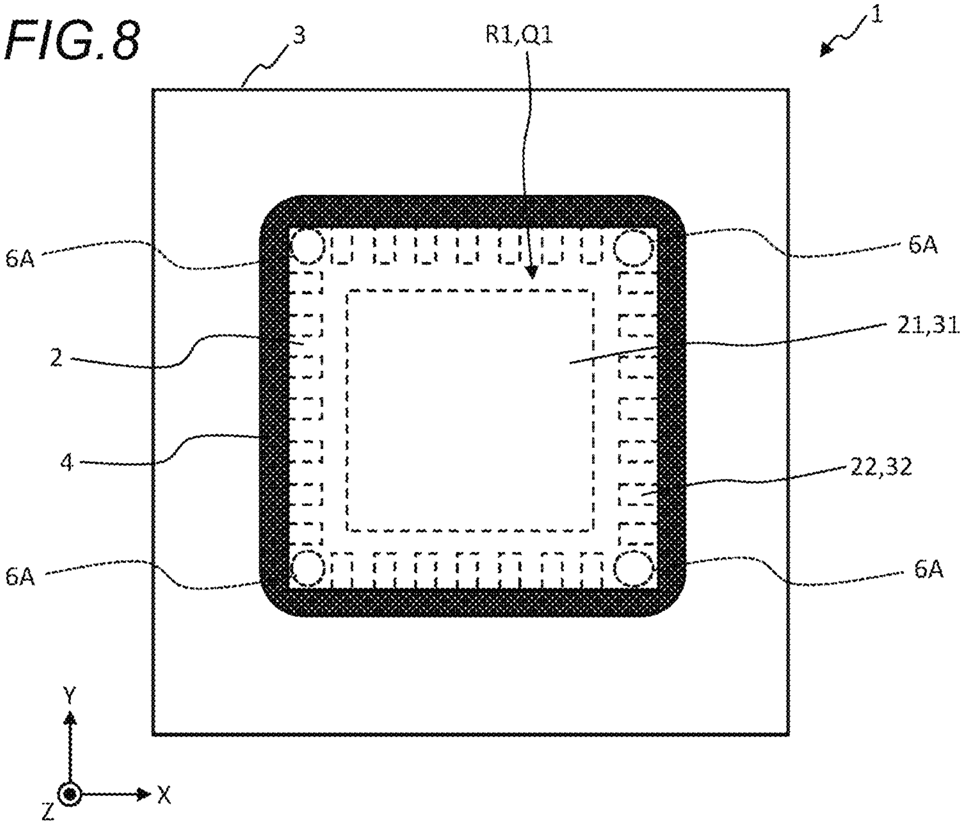
FIG. 8 is a plan view showing an example in which the board through-holes are provided in corners of the mounting board including the QFN according to the present embodiment.

FIG. 8 is a plan view showing an example in which the board through-holes 6A are provided in corners of the mounting board 1 including the QFN 2A according to the present embodiment.

When the non-land region R1 is narrow as shown in FIG. 8 and it is difficult to provide the board through-hole 6A in the non-land region R1 as shown in FIG. 6 or 7, the board through-hole 6A may be provided in a region where the land 32 does not exist in the vicinity of corners of the QFN 2A. The board through-holes 6A may be provided in all of the four corners, or may be provided in any of the four corners. The number of the board through-holes 6A may be any one to four.

Accordingly, four board through-holes 6A are disposed sufficiently apart from each other, so that all of the four board through-holes 6A can be prevented from being blocked by the reinforcing resin 4 used for the sidefill.

Figure 9A:
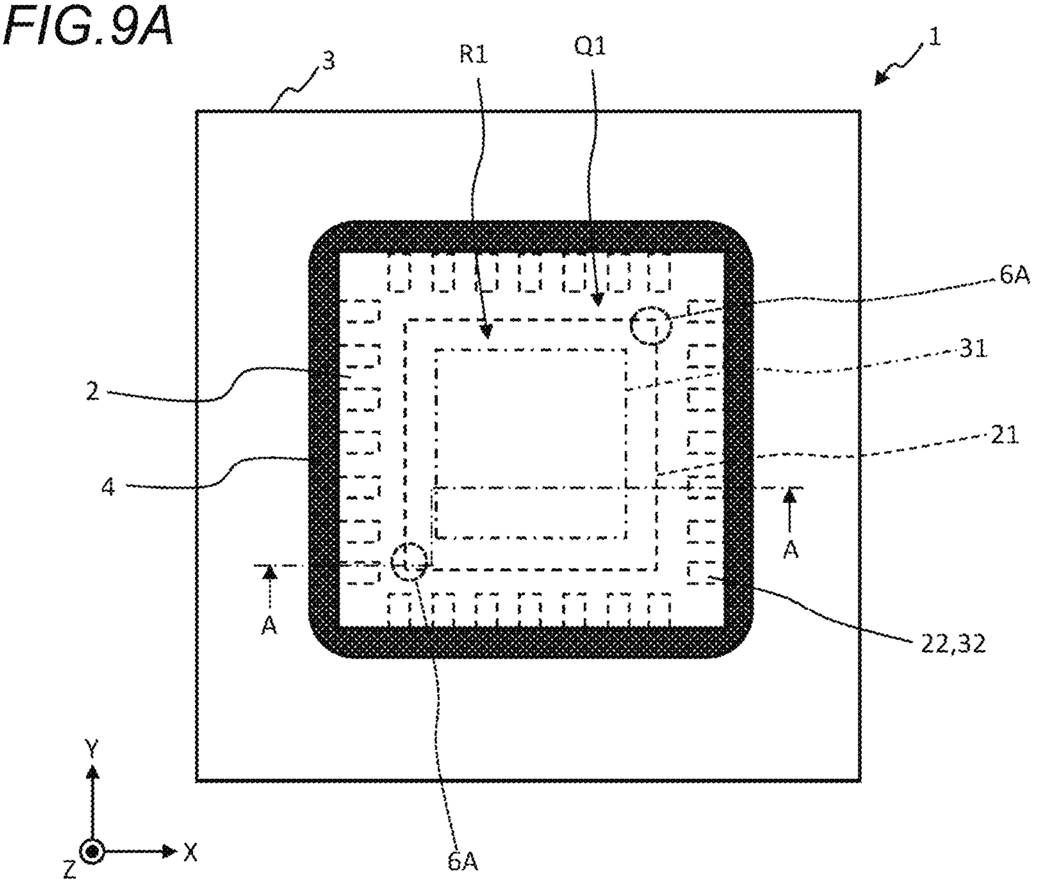
FIG. 9A is a plan view showing an example in which a size of a GND land is reduced to provide the board through-holes in the mounting board including the QFN according to the present embodiment.
Figure 9B:
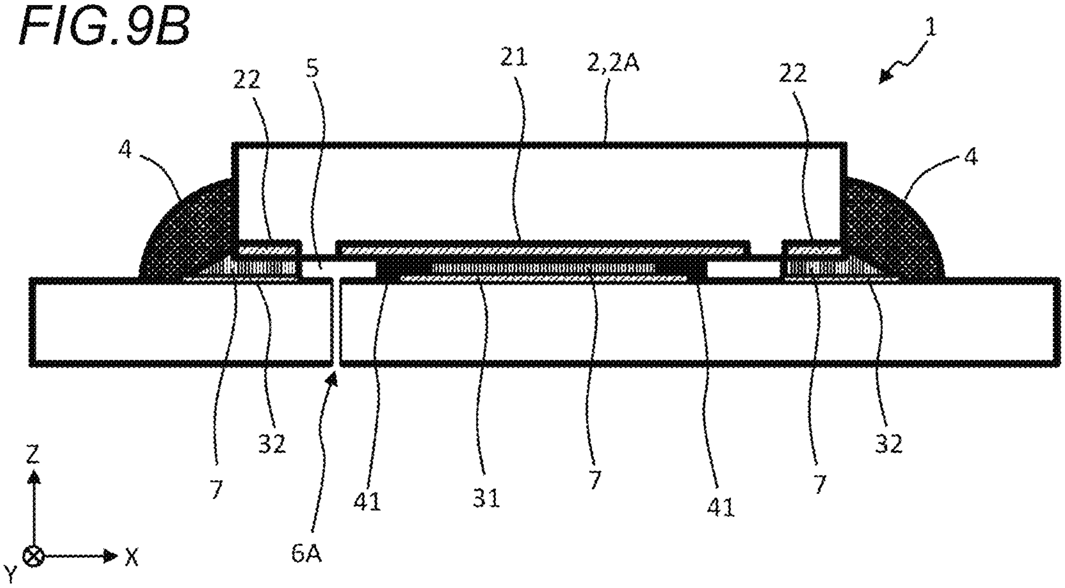
FIG. 9B is a cross-sectional view showing an example in which the size of the GND land is reduced to provide the board through-holes in the mounting board including the QFN according to the present embodiment.

FIG. 9A is a plan view showing an example in which a size of the GND land 31 is reduced to provide the board through-holes 6A in the mounting board 1 including the QFN 2A according to the present embodiment. FIG. 9B is a cross-sectional view showing an example in which the size of the GND land 31 is reduced to provide the board through-holes 6A in the mounting board 1 including the QFN 2A according to the present embodiment. The cross-sectional view shown in FIG. 9B is a cross-sectional view taken along a line A-A in the plan view shown in FIG. 9A.

When the non-contact region Q1 between the GND terminal 21 and the connection terminals 22 of the QFN 2A is narrow, as shown in FIGS. 9A and 9B, the GND land 31 of the printed board 3 may be slightly smaller than the GND terminal 21 to expand the non-land region R1, and the board through-holes 6A may be provided in the non-land region R1.

At this time, as shown in FIG. 9B, a resin 41 such as a solder resist may be provided to surround the solder joint 7 that joins the GND land 31 to the GND terminal 21. The resin provided to surround the solder joint 7 is referred to as a protective resin 41. The protective resin 41 can prevent the board through-holes 6A from being blocked by the flux residues of the solder joint 7 that joins the GND land 31 to the GND terminal 21. In addition, the protective resin 41 prevents the QFN 2A from sinking in a direction approaching the printed board 3, so that it is possible to prevent the board through-hole 6A from being blocked by the sink of the QFN 2A.

Figure 10:
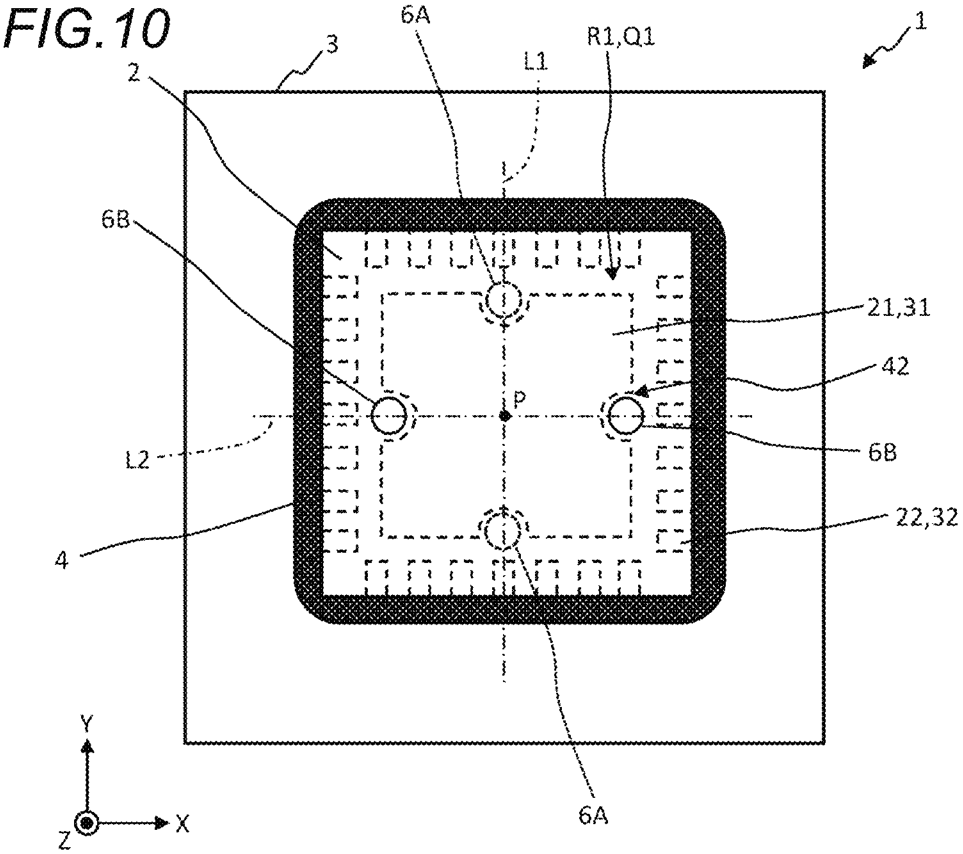
FIG. 10 is a plan view showing an example in which a part of the GND land and a GND terminal is cut to provide through-holes in the mounting board including the QFN according to the present embodiment.

FIG. 10 is a plan view showing an example in which a part of the GND land 31 and the GND terminal 21 is cut to provide the through-holes 6 in the mounting board 1 including the QFN 2A according to the present embodiment.

When the non-contact region Q1 between the GND terminal 21 and the connection terminals 22 of the QFN 2A is narrow, a part of the GND land 31 and the GND terminal 21 may be cut, and the board through-holes 6A and/or the component through-holes 6B may be provided in regions 42 that are cut (hereinafter, referred to as cut regions). For example, as shown in FIG. 10, two cut regions 42 may be provided on positions of the first line L1 passing through the center point P of the GND land 31 and orthogonal to one side of the GND land 31 with the GND land 31 interposed therebetween. Further, two cut regions 42 may be provided on positions of the second line L2 passing through the center point P of the GND terminal 21 and orthogonal to the first line L1 with the GND terminal 21 interposed therebetween. Accordingly, even when the non-contact region Q1 is narrow, the board through-holes 6A and/or the component through-holes 6B can also be provided.

Figure 11A:
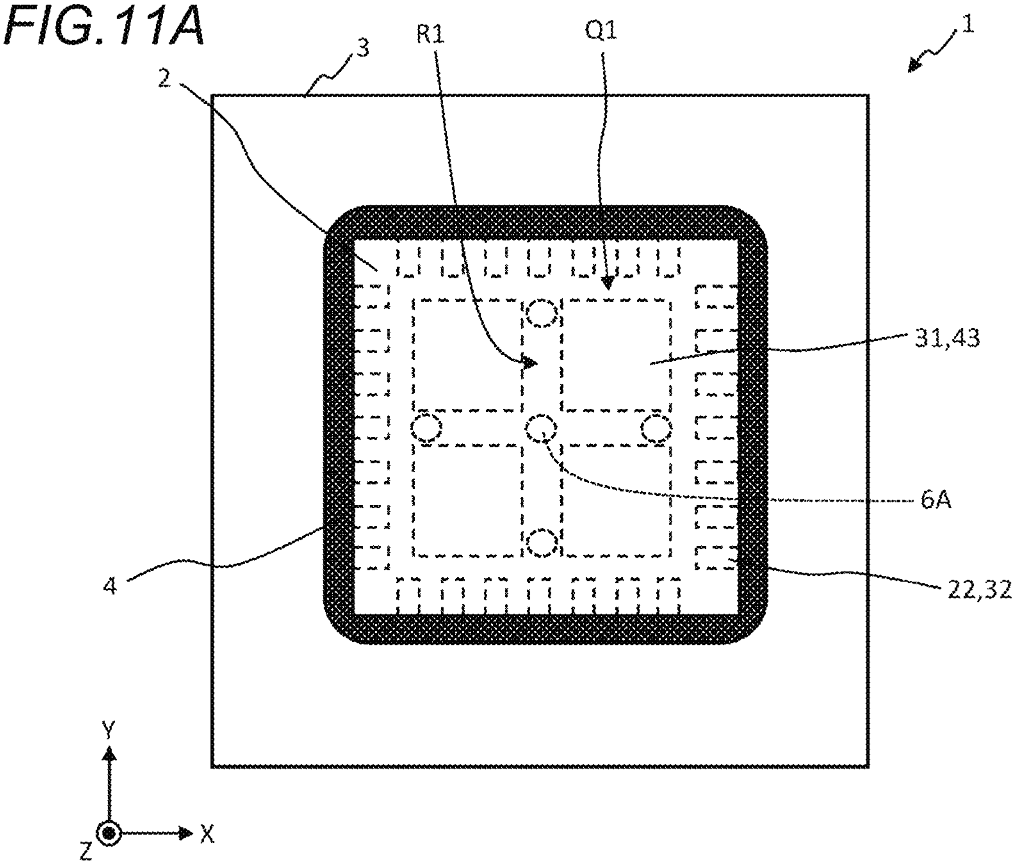
FIG. 11A is a plan view showing a first example in which the GND land is divided and a board through-hole is provided between the divided GND lands in the mounting board including the QFN according to the present embodiment.

FIG. 11A is a plan view showing a first example in which the GND land 31 is divided and the board through-hole 6A is provided between the divided GND lands 31 in the mounting board 1 including the QFN 2A according to the present embodiment.

Figure 11B:
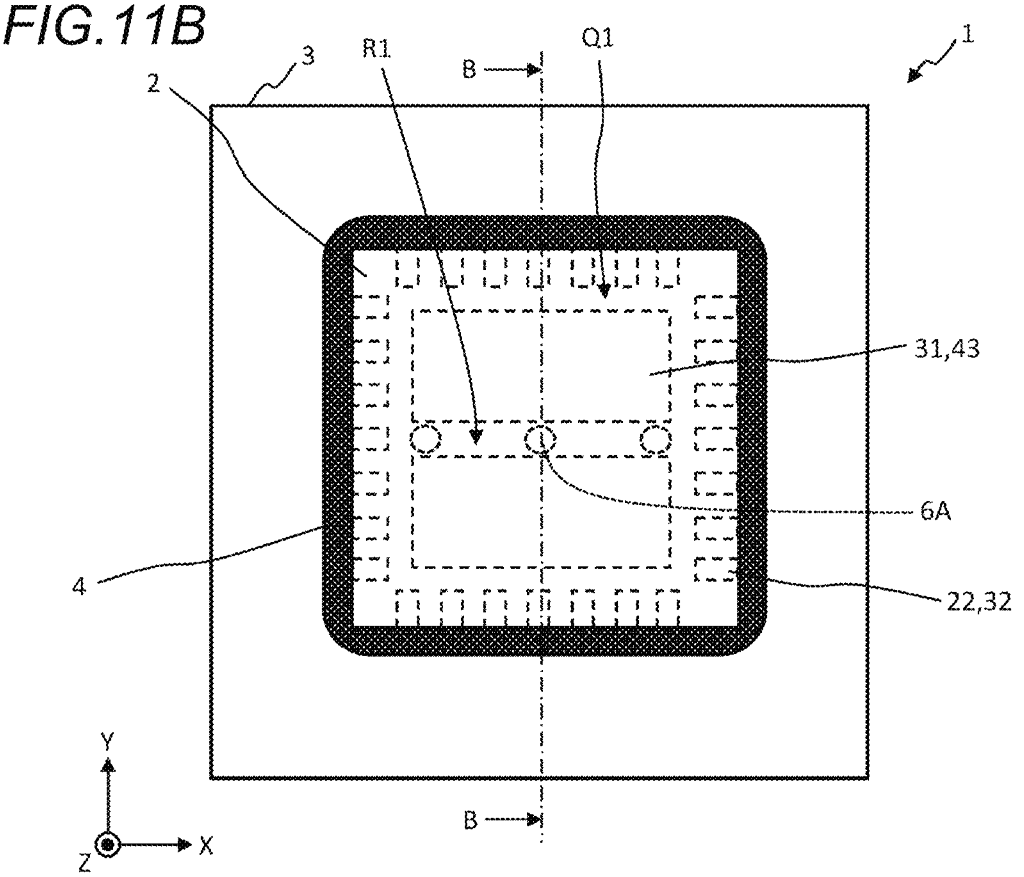
FIG. 11B is a plan view showing a second example in which the GND land is divided and a board through-hole is provided between the divided GND lands in the mounting board including the QFN according to the present embodiment.
Figure 11C:
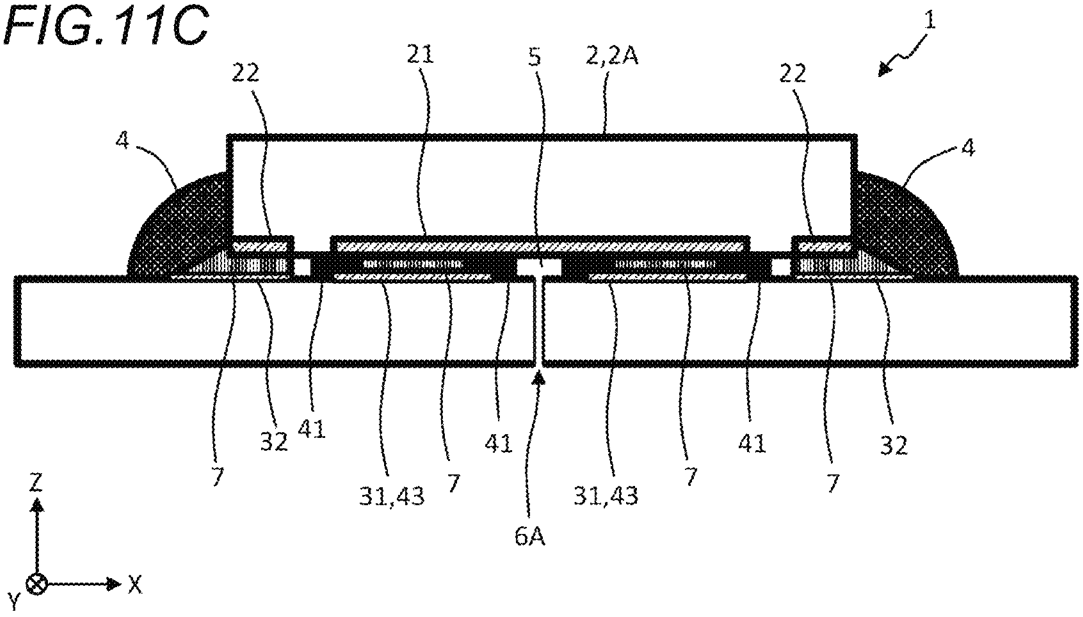
FIG. 11C is a cross-sectional view showing an example in which the GND land is divided and a board through-hole is provided between the divided GND lands in the mounting board including the QFN according to the present embodiment.

FIG. 11B is a plan view showing a second example in which the GND land 31 is divided and the board through-hole 6A is provided between the divided GND lands 31 in the mounting board 1 including the QFN 2A according to the present embodiment. FIG. 11C is a cross-sectional view showing an example in which the GND land 31 is divided and the board through-hole 6A is provided between the divided GND lands 31 in the mounting board 1 including the QFN 2A according to the present embodiment. The cross-sectional view shown in FIG. 11C is a cross-sectional view taken along a line B-B in the plan view shown in FIG. 11B.

When the non-contact region Q1 between the GND terminal 21 and the connection terminal 22 of the QFN 2A is narrow, as shown in FIG. 11A or FIG. 11B, the GND land 31 of the printed board 3 may be divided, and the board through-holes 6A may be provided in the non-land region R1 between the divided GND lands (hereinafter, referred to as divided GND lands 43).

For example, as shown in FIG. 11A, the GND land 31 is divided into four parts in a cross shape, and the board through-hole 6A is provided at a center of the cross-shaped non-land region R1 formed between the four divided GND lands 43. Alternatively, as shown in FIG. 11B, the GND land 31 is divided into two parts in an X-axis direction, and the board through-hole 6A is provided at the center of the horizontally long non-land region R1 formed between the two divided GND lands 43. Accordingly, even when the non-contact region Q1 is narrow, the board through-holes 6A can also be provided.

At this time, as shown in FIG. 11C, the protective resin 41 may be provided to surround the solder joint 7 that joins the divided GND lands 43 of the printed board 3 to the GND terminal 21 of the QFN 2A. The protective resin 41 can prevent the board through-holes 6A from being blocked by the flux residues of the solder joint 7 that joins the divided GND lands 43 to the GND terminal 21. In addition, the protective resin 41 prevents the QFN 2A from sinking in a direction approaching the printed board 3, so that it is possible to prevent the board through-hole 6A from being blocked by the sink of the QFN 2A.

As shown in FIG. 11A, the board through-hole 6A may be provided at an end of the cross-shaped non-land region R1. As shown in FIG. 11B, the board through-hole 6A may be provided at an end of the horizontally long non-land region R1. The number of the board through-holes 6A may be one or more.

Figure 12:
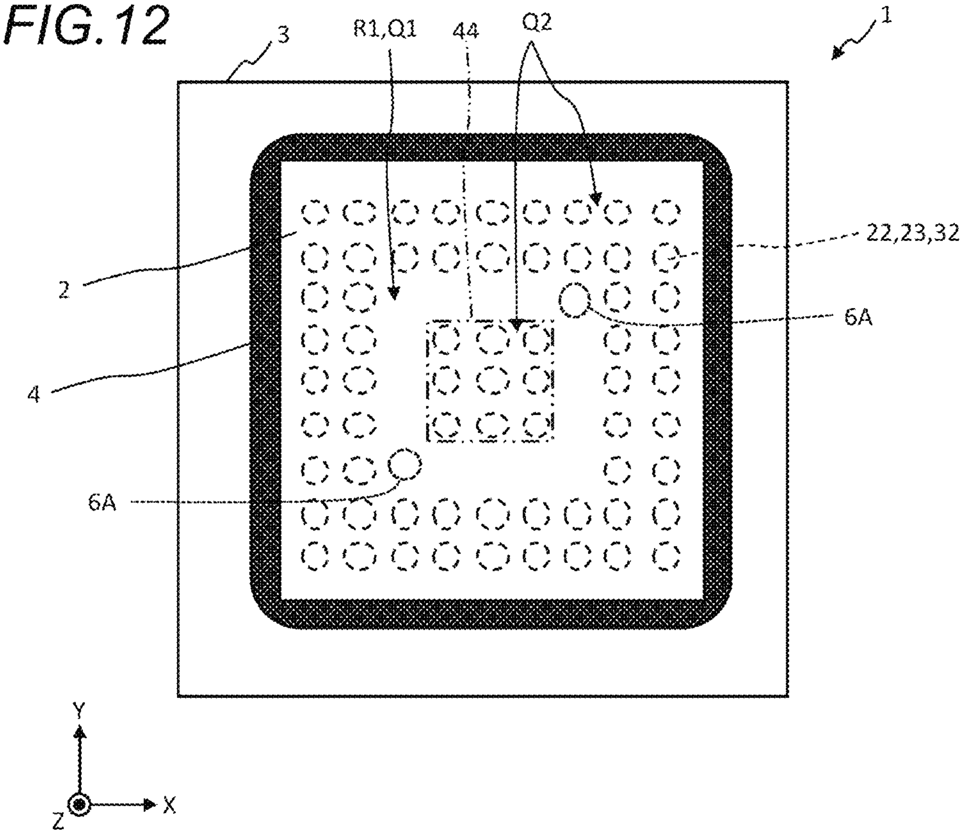
FIG. 12 is a plan view showing an example in which board through-holes are provided in the printed board in the mounting board including the BGA according to the present embodiment.

FIG. 12 is a plan view showing an example in which board through-holes 6A are provided in the printed board 3 in the mounting board 1 including the BGA 2B according to the present embodiment.

As shown in FIG. 12, the BGA 2B includes the solder balls 23 as the plurality of connection terminals 22. The printed board 3 includes the lands 32 to which the solder balls 23 of the BGA 2B are joined in a portion where the BGA 2B is mounted. The printed board 3 does not include the lands 32 in a region facing a region where no solder ball 23 of the BGA 2B is provided. The region including no land 32 is referred to as the non-land region R1. In the BGA 2B, a region where the plurality of solder balls 23 are provided is referred to as a contact region Q2, and a region where no solder ball 23 is provided is referred to as the non-contact region Q1.

For example, as shown in FIG. 12, the BGA 2B may include the contact region Q2 in which the plurality of solder balls 23 are provided in a rectangular region (for example, a region in which the die 44 exists) of a central portion, include the non-contact region Q1 to surround the contact region Q2 of the central portion, and include the contact region Q2 in which the plurality of solder balls 23 are provided to surround the non-contact region Q1. In this case, a region of the printed board 3 facing the non-contact region Q1 is the non-land region R1. The die 44 may be read as another term such as a silicon die or an IC chip.

The board through-hole 6A may be provided in the non-land region R1. For example, as shown in FIG. 12, two board through-holes 6A are provided at positions of opposing corners of the non-land region R1. Accordingly, the two board through-holes 6A are disposed sufficiently apart from each other, so that both the two board through-holes 6A can be prevented from being blocked by the reinforcing resin 4 used for the sidefill. The number of the board through-holes 6A is not limited to two, and may be one or three or more.

Figure 13:
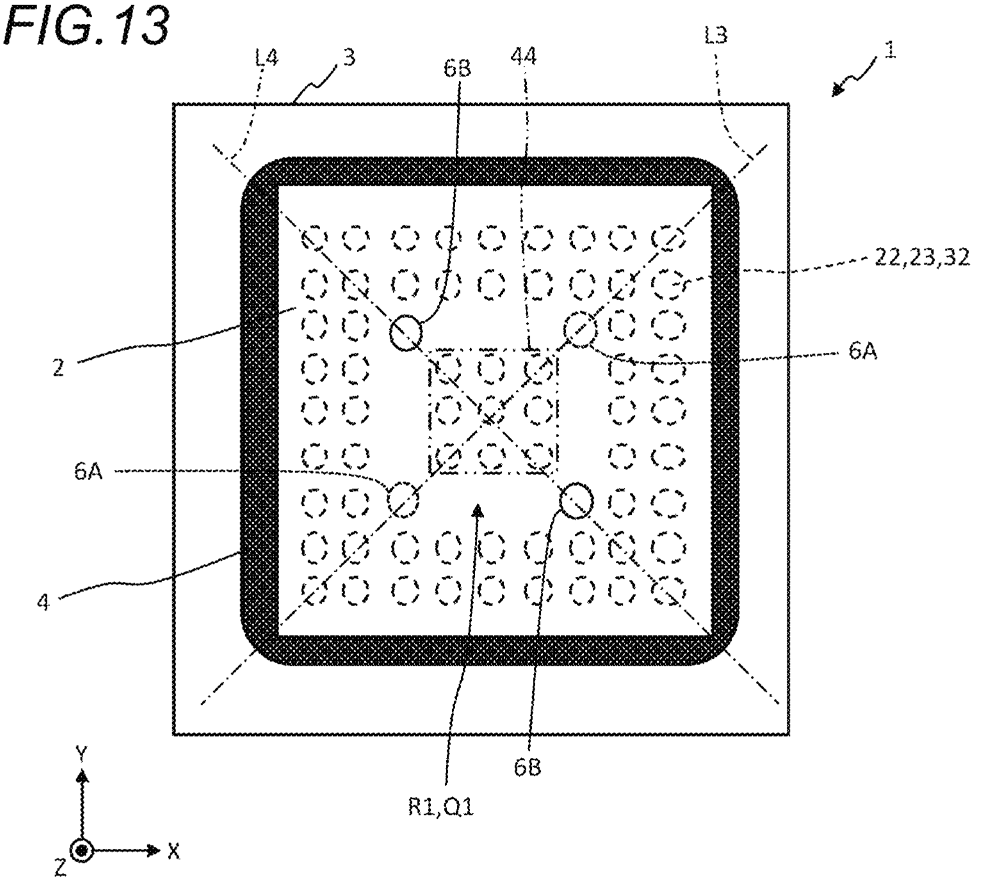
FIG. 13 is a plan view showing a first example in which through-holes are provided in the printed board and the BGA in the mounting board including the BGA according to the present embodiment.

FIG. 13 is a plan view showing a first example in which the through-holes 6 are provided in the printed board 3 and the BGA 2B in the mounting board 1 including the BGA 2B according to the present embodiment.

Two board through-holes 6A may be provided at positions of opposing corners of the non-land region R1 of the printed board 3. Two component through-holes 6B may be provided at positions of opposing corners of the non-contact region Q1 of the BGA 2B.

The board through-hole 6A and the component through-hole 6B may be provided at different positions. That is, the board through-hole 6A and the component through-hole 6B may be provided so as not to be aligned on a straight line in a Z-axis direction. For example, as shown in FIG. 13, two board through-holes 6A and two component through-holes 6B may be provided such that a third line L3 connecting the two board through-holes 6A and a fourth line L4 connecting the two component through-holes 6B intersect with each other. Accordingly, the board through-holes 6A and the component through-holes 6B can be prevented from being blocked by the reinforcing resin 4 used for the sidefill. The number of the board through-holes 6A is not limited to two, and may be one or three or more. The number of component through-holes 6B is not limited to two, and may be one or three or more.

Figure 14A:
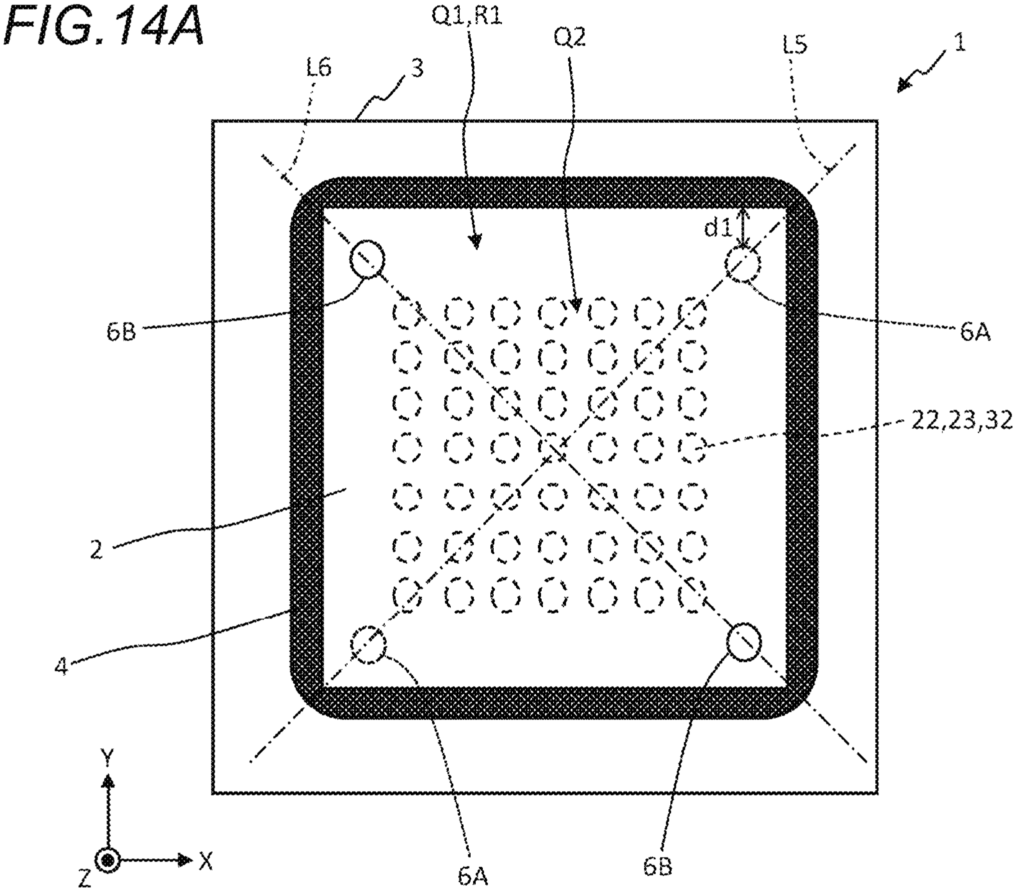
FIG. 14A is a plan view showing a second example in which through-holes are provided in the printed board and the BGA in the mounting board including the BGA according to the present embodiment.
Figure 14B:
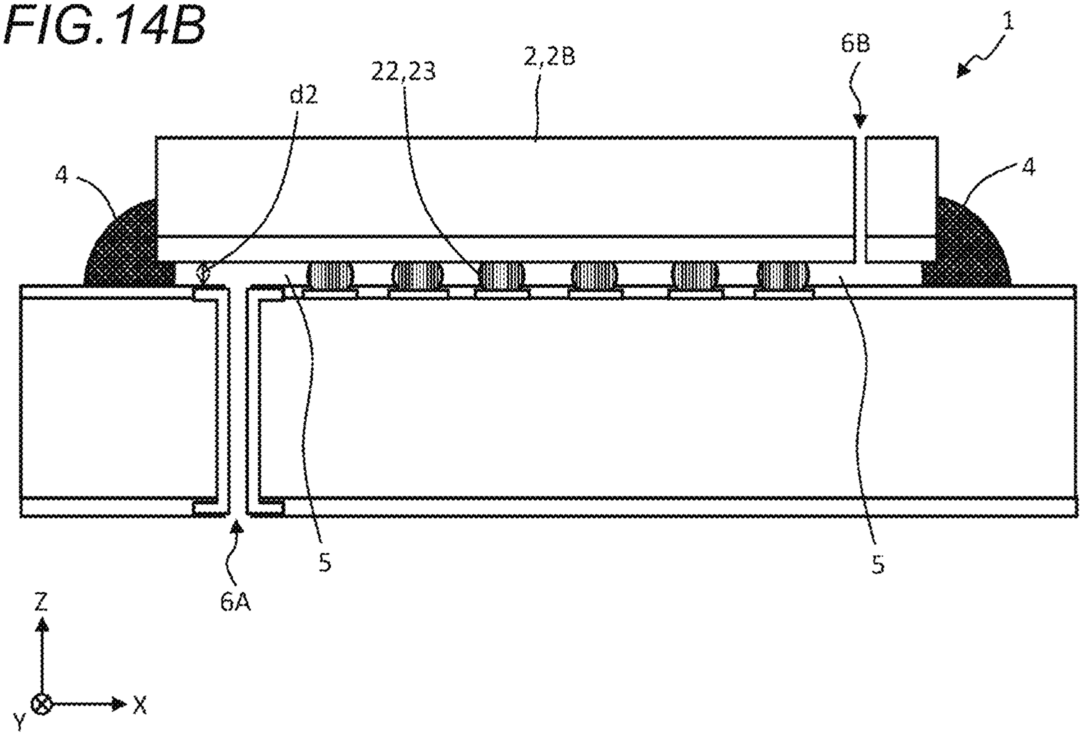
FIG. 14B is a cross-sectional view showing the second example in which through-holes are provided in the printed board and the BGA in the mounting board including the BGA according to the present embodiment.

FIG. 14A is a plan view showing a second example in which the through-holes 6 are provided in the printed board 3 and the BGA 2B in the mounting board 1 including the BGA 2B according to the present embodiment. FIG. 14B is a cross-sectional view showing the second example in which the through-holes 6 are provided in the printed board 3 and the BGA 2B in the mounting board 1 including the BGA 2B according to the present embodiment.

As shown in FIG. 14A, the BGA 2B includes the contact region Q2 in a central portion of the BGA 2B and the non-contact region Q1 surrounding the contact region Q2. In this case, a region of the printed board 3 facing the non-contact region Q1 (that is, a portion near the outer periphery of the BGA 2B) is the non-land region R1.

Two board through-holes 6A may be provided in the vicinity of opposing corners of the non-land region R1. Two component through-holes 6B may be provided in the vicinity of opposing corners of the non-contact region Q1.

The board through-hole 6A and the component through-hole 6B may be provided at different positions. That is, the board through-hole 6A and the component through-hole 6B may be provided so as not to be aligned on a straight line in a Z-axis direction. For example, as shown in FIG. 14A, two board through-holes 6A and two component through-holes 6B may be provided such that a fifth line L5 connecting the two board through-holes 6A and a sixth line L6 connecting the two component through-holes 6B intersect with each other.

The board through-hole 6A may be provided such that a distance d1 between the board through-hole 6A and the outer periphery of the BGA 2B is longer than a distance d2 between a lower surface of the BGA 2B and the upper surface of the printed board 3 (that is, such that the board through-hole 6A is located inside). Accordingly, the reinforcing resin 4 used for the sidefill that has entered the under-component space 5 does not reach the board through-hole 6A. Thus, the board through-hole 6A can be prevented from being blocked by the reinforcing resin 4 used for the sidefill.

Figure 15:
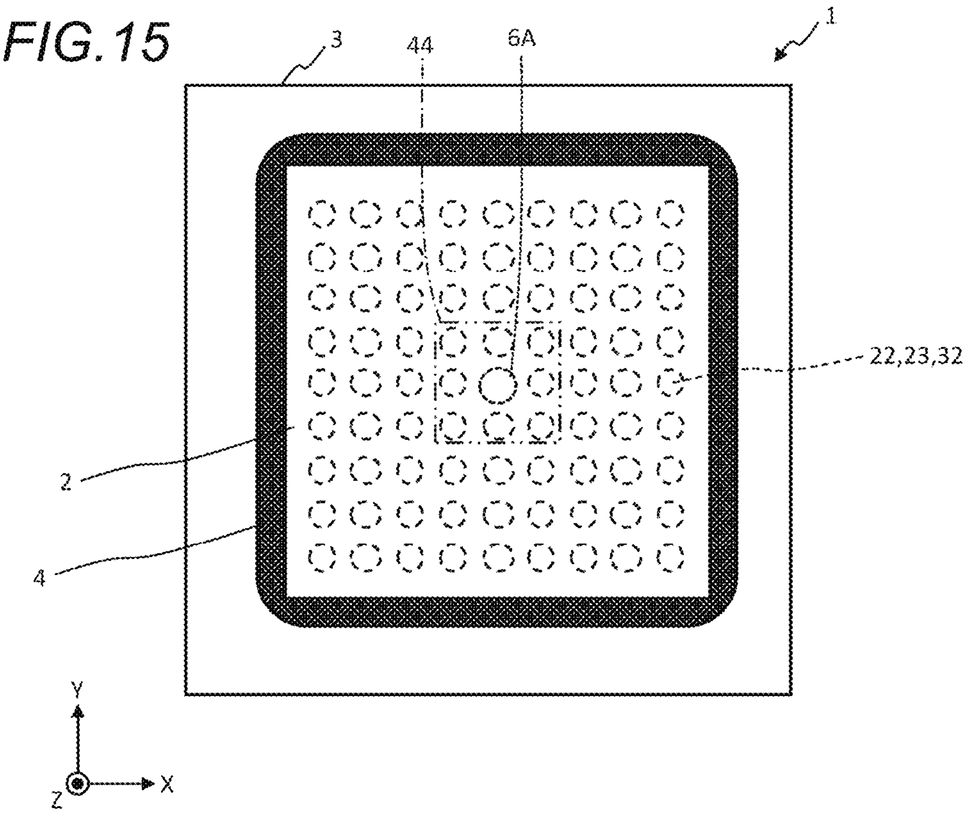
FIG. 15 is a plan view showing a first example in which, in the mounting board including the BGA according to the present embodiment, a board through-hole is provided without providing a solder ball in a portion of the BGA and without providing a land at a position of the printed board facing the portion where the solder ball is not provided.

FIG. 15 is a plan view showing a first example in which, in the mounting board 1 including the BGA 2B according to the present embodiment, the board through-hole 6A is provided without providing the solder ball 23 in a portion of the BGA 2B and without providing the land 32 at a position of the printed board 3 facing the portion where the solder ball 23 is not provided.

As shown in FIG. 15, the solder ball 23 may not be provided at the central portion of the BGA 2B (for example, a central portion of the die 44) which is less affected by land lead lines, and the land 32 may not be provided at the position of the printed board 3 facing the portion where the solder ball 23 is not provided. The board through-hole 6A may be provided in a portion of the printed board 3 where the land 32 is not provided. Accordingly, even in the BGA 2B without the sufficient non-contact region Q1 and non-land region R1 as shown in FIG. 12, the board through-hole 6A can be provided while reducing an influence on the BGA 2B.

Figure 16:
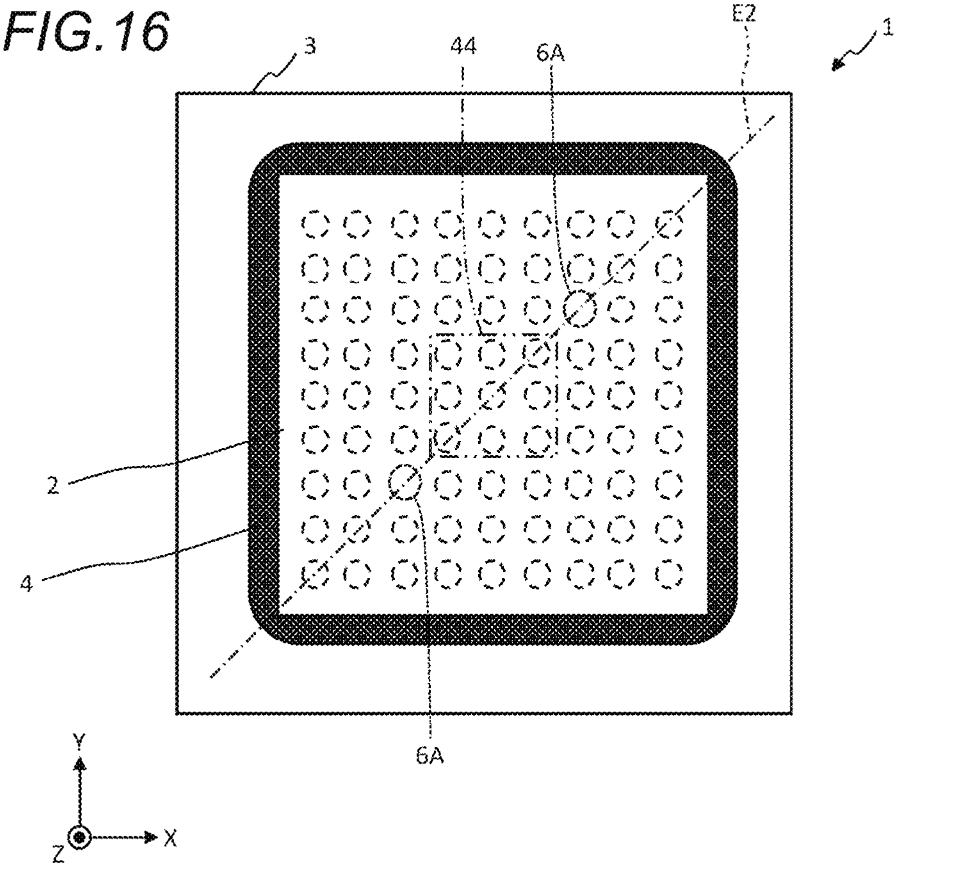
FIG. 16 is a plan view showing a second example in which, in the mounting board including the BGA according to the present embodiment, a board through-hole is provided without providing a solder ball in a portion of the BGA and without providing a land at a position of the printed board facing the portion where the solder ball is not provided.

FIG. 16 is a plan view showing a second example in which, in the mounting board 1 including the BGA 2B according to the present embodiment, the board through-holes 6A are provided without providing the solder ball 23 in a portion of the BGA 2B and without providing the land 32 at a position of the printed board 3 facing the portion where the solder ball 23 is provided.

As shown in FIG. 16, the solder ball 23 is not provided at a position outside the die 44 in the vicinity of the corners of the die 44 to which a durability damage is applied, and the land 32 is not provided at a position of the printed board 3 facing the portion where the solder ball 23 is not provided. The board through-hole 6A may be provided in a portion of the printed board 3 where the land 32 is not provided. For example, two board through-holes 6A may be provided at positions outside the die 44 on the extension of the diagonal line E2 of the die 44 with the die 44 interposed therebetween. Accordingly, the two board through-holes 6A can be prevented from being blocked by the reinforcing resin 4 used for the sidefill. The number of the board through-holes 6A is not limited to two, and may be one or three or more.

Figure 17A:
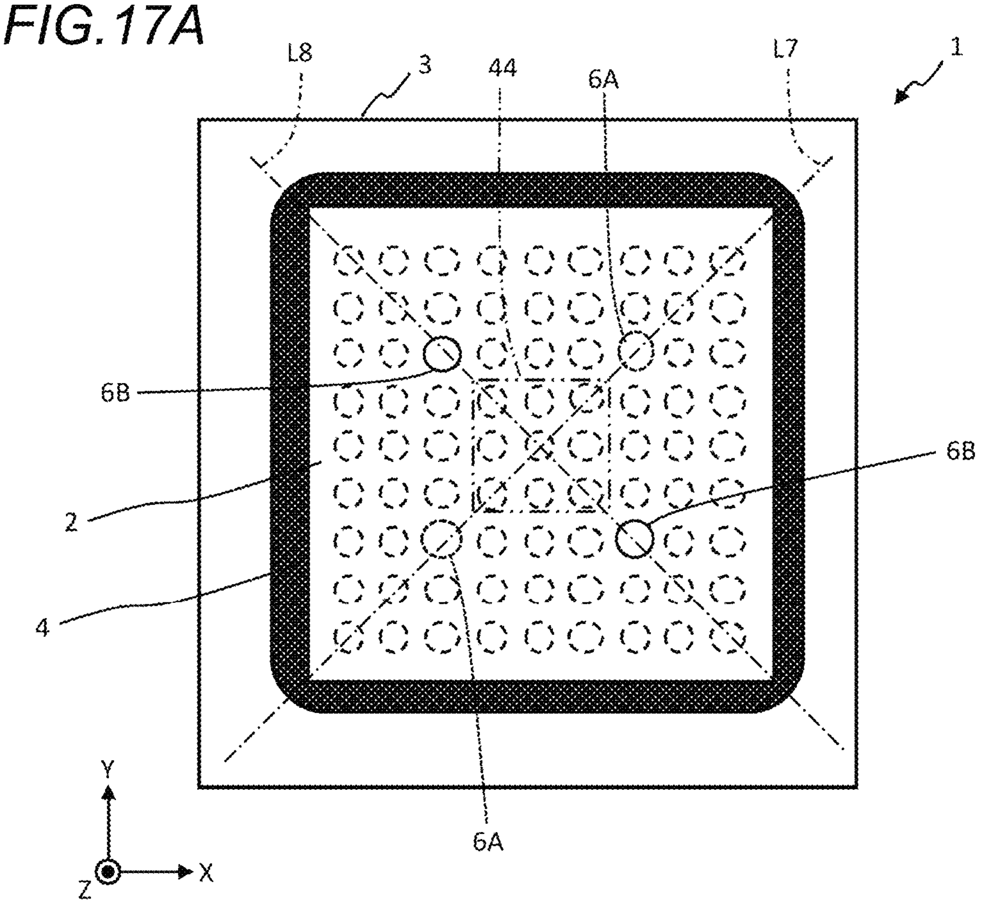
FIG. 17A is a plan view showing an example in which, in the mounting board including the BGA according to the present embodiment, a component through-hole is provided without providing a solder ball in a portion of the BGA and a board through-hole is provided without providing a land at a position of the printed board facing the portion where the solder ball is not provided.
Figure 17B:
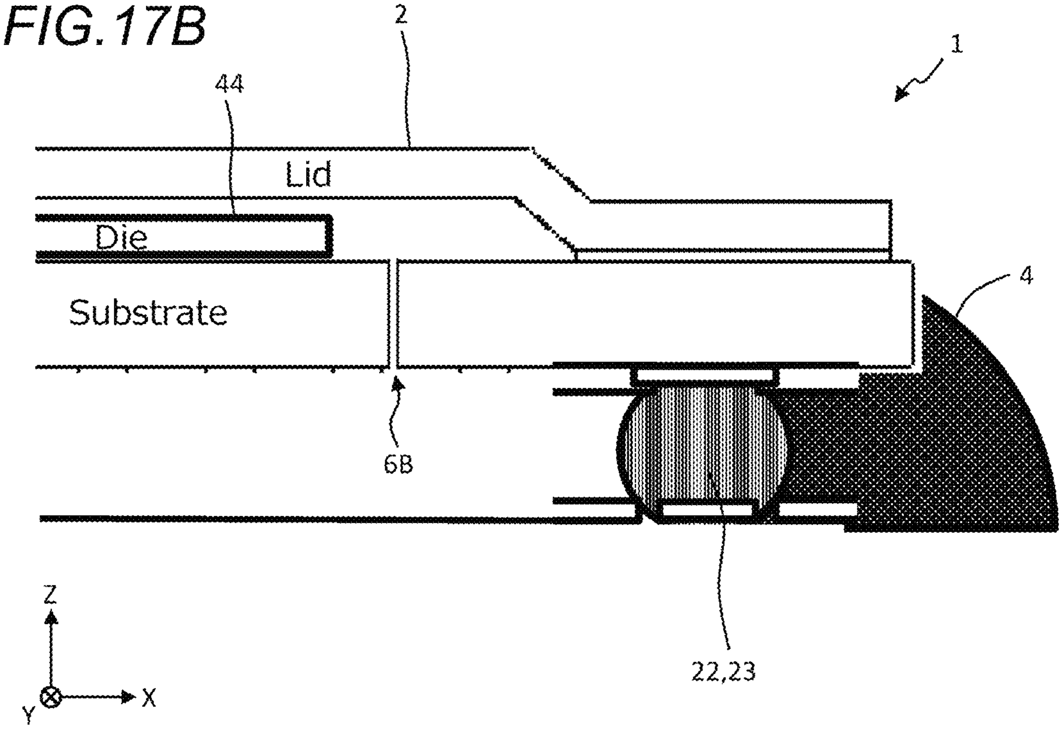
FIG. 17B is a cross-sectional view showing an example in which a component through-hole is provided in a portion of the BGA in the mounting board shown in FIG. 17A.

FIG. 17A is a plan view showing a first example in which, in the mounting board 1 including the BGA 2B according to the present embodiment, the component through-hole 6B is provided without providing the solder ball 23 in a portion of the BGA 2B and the board through-hole 6A is provided without providing the land 32 at a position of the printed board 3 facing the portion where the solder ball 23 is not provided. FIG. 17B is a cross-sectional view showing an example in which the component through-hole 6B is provided in a portion of the BGA 2B in the mounting board 1 shown in FIG. 17A.

As shown in FIGS. 17A and 17B, the solder ball 23 is not provided in the vicinity of the corner of the die 44 to which the durability damage is applied, and the land 32 is not provided at the position of the printed board 3 facing the portion where the solder ball 23 is not provided. The board through-hole 6A may be provided in a position of the printed board 3 where the land 32 is not provided. The component through-hole 6B is provided at a position of the BGA 2B where the solder ball 23 is not provided.

The board through-hole 6A and the component through-hole 6B may be provided at different positions. That is, the board through-hole 6A and the component through-hole 6B may be provided so as not to be aligned on a straight line in a Z-axis direction. For example, two board through-holes 6A and two component through-holes 6B may be provided such that a seventh line L7 connecting the two board through-holes 6A and an eighth line L8 connecting the two component through-holes 6B intersect with each other. Accordingly, the board through-holes 6A and the component through-holes 6B can be prevented from being blocked by the reinforcing resin 4 used for the sidefill. The number of the board through-holes 6A is not limited to two, and may be one or three or more. The number of component through-holes 6B is not limited to two, and may be one or three or more.

Figure 18:
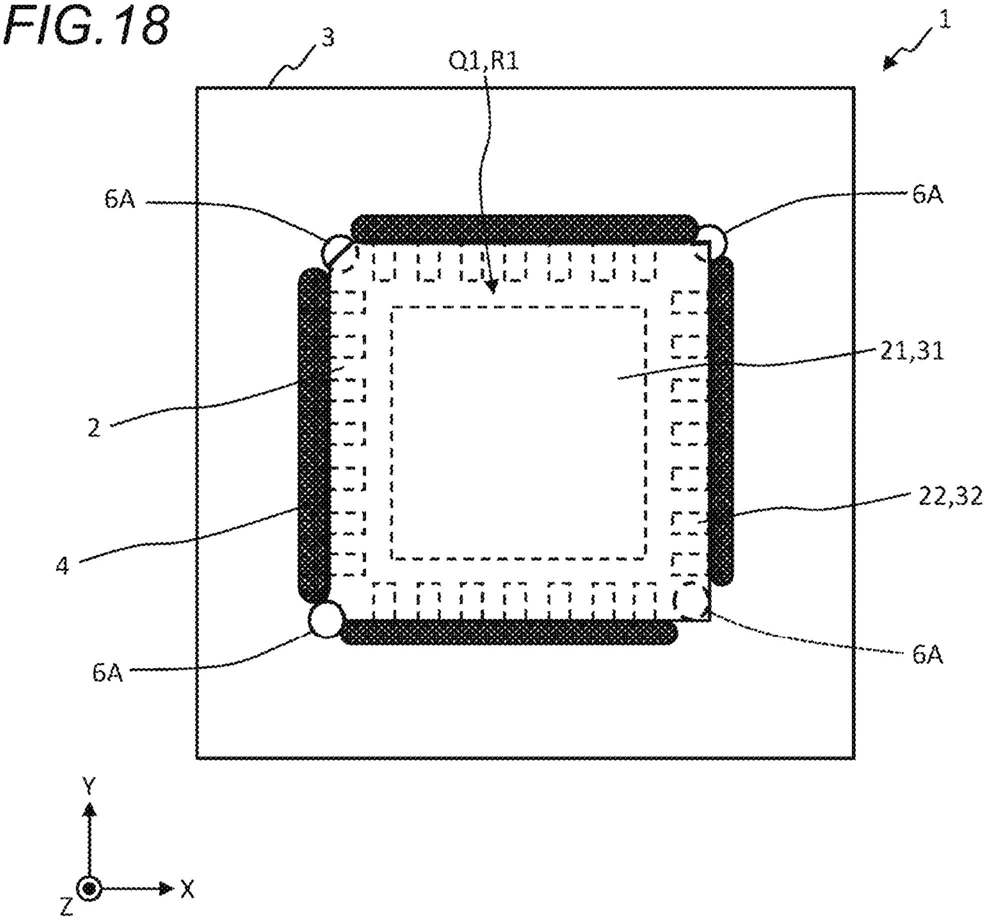
FIG. 18 is a plan view showing an example in which corners of the QFN are not closed with a reinforcing resin used for the sidefill in the mounting board including the QFN according to the present embodiment.

FIG. 18 is a plan view showing an example in which the corners of the QFN 2A are not closed with the reinforcing resin 4 used for the sidefill in the mounting board 1 including the QFN 2A according to the present embodiment.

When the non-contact region Q1 between the GND terminal 21 and the connection terminal 22 of the QFN 2A is narrow, as shown in FIG. 18, the reinforcing resin 4 used for the sidefill may be applied so as not to block at least one corner of the QFN 2A.

In addition, the board through-holes 6A may be provided in the vicinity of the corners of the QFN 2A. Accordingly, even when the heated reinforcing resin 4 is fluidized and slightly flows, the fluidized reinforcing resin 4 flows down through the board through-hole 6A, so that it is possible to prevent the board through-holes 6A from being blocked by the reinforcing resin 4. At least one corner of the corners of the QFN 2A may be C-chamfered. In addition, at least one corner of the corners of the QFN 2A may have a quarter-circular hole shape.

SUMMARY OF PRESENT DISCLOSURE

Contents of the present disclosure can be expressed as the following appendixes.

APPENDIX 1

In the mounting board 1 in which the electronic component 2 is mounted on the printed board 3, the electronic component 2 is surface-mounted on the printed board 3, the resin 4 used for the sidefill is applied to an outer periphery of the electronic component 2, and at least one of the printed board 3 and the electronic component 2 is provided with the through-hole 6 connected to a space (that is, the under-component space 5) formed by the printed board 3, the electronic component 2, and the resin 4 used for the sidefill.

Accordingly, the air and moisture in the under-component space 5 expanded by the heating are output to the outside through the through-hole 6, so that the opening of the hole in the resin 4 used for the sidefill can be avoided.

APPENDIX 2

In the mounting board 1 according to Appendix 1, the through-hole 6 is provided inside the outer periphery of the electronic component 2 by a predetermined distance or more. Accordingly, even when the resin 4 used for the sidefill enters the space 5 of a gap between the electronic component 2 and the printed board, the resin 4 used for the sidefill does not reach the through-hole 6. Accordingly, it is possible to prevent the through-hole 6 from being blocked by the resin 4 used for the sidefill.

APPENDIX 3

In the mounting board 1 according to Appendix 1 or 2, the through-hole 6 is provided in each of the printed board 3 and the electronic component 2.

Accordingly, it is possible to prevent all the through-holes 6 from being blocked.

APPENDIX 4

In the mounting board 1 according to Appendix 3, the through-hole 6 of the printed board 3 (that is, the board through-hole 6A) and the through-hole 6 of the electronic component 2 (that is, the component through-hole 6B) are provided at different positions in a plane view.

Accordingly, it is possible to prevent the board through-hole 6A and the component through-hole 6B from being blocked simultaneously.

APPENDIX 5

In the mounting board 1 according to any one of Appendixes 1 to 4, the electronic component 2 is a quad flat non-leaded package (QFN) 2A, and the through-hole 6A of the printed board 3 is provided to avoid the GND land 31 of the QFN 2A.

Accordingly, the board through-hole 6A is connected to the under-component space without being hindered by the GND land 31.

APPENDIX 6

In the mounting board 1 according to Appendix 5, at least two through-holes 6A of the printed board 3 are provided with the GND land 31 interposed therebetween.

Accordingly, at least two board through-holes 6A are disposed sufficiently apart from each other, so that both the two board through-holes 6A can be prevented from being blocked by the resin 4 used for the sidefill.

APPENDIX 7

In the mounting board 1 according to Appendix 5, the through-holes 6A of the printed board 3 are provided between a plurality of divided GND lands 43 obtained by dividing the GND land 31.

Accordingly, even when the non-contact region Q1 between the GND terminal 21 and the connection terminal 22 of the QFN 2A is narrow, the board through-hole 6A can also be provided.

APPENDIX 8

In the mounting board 1 according to Appendix 5, a size of the GND land 31 is smaller than a size of the GND terminal 21 of the QFN 2A joined to the GND land 31 by solder (for example, the solder joint 7).

Accordingly, since the non-land region R1 in which the GND land 31 does not exist is enlarged by reducing the size of the GND land 31, the board through-hole 6A can be provided only when the non-contact region Q1 between the GND terminal 21 and the connection terminal 22 of the QFN 2A is narrow.

APPENDIX 9

In the mounting board 1 according to Appendix 8, an outer periphery of the solder (for example, the solder joint 7) that joins the GND land 31 to the GND terminal 21 is surrounded with the resin 41.

By providing the resin 41, it is possible to prevent the board through-hole 6A from being blocked by the flux residues of the solder (for example, the solder joint 7) that joins the GND land 31 to the GND terminal 21. In addition, by providing the resin 41, the QFN 2A is prevented from sinking in a direction approaching the printed board 3, so that it is possible to prevent the board through-hole 6A from being blocked by the sink of the QFN 2A.

APPENDIX 10

In the mounting board 1 according to any one of Appendixes 1 to 4, the electronic component 2 is the ball grid array (BGA) 2B, and the through-hole 6A of the printed board 3 is provided to avoid a plurality of solder balls 23 disposed in the BGA 2B.

Accordingly, the board through-hole 6A is connected to the under-component space without being hindered by the solder ball 23.

APPENDIX 11

In the mounting board 1 according to Appendix 10, the solder ball 23 is not provided at a position of a center of the die 44 disposed on the BGA 2B, and the through-hole 6A of the printed board 3 is provided at a position of the center of the die 44 where no solder ball 23 is provided.

Accordingly, the board through-hole 6A can be provided while reducing an influence on the BGA 2B.

APPENDIX 12

In the mounting board 1 according to Appendix 10, the solder ball 23 is not provided at a position of a corner of the die 44 disposed in the BGA 2B outside the die 44, and the through-hole 6A of the printed board 3 is provided at a position of the corner of the die 44 outside the die 44 where no solder ball 23 is provided.

Accordingly, the board through-hole 6A can be provided while reducing an influence on the BGA 2B.

APPENDIX 13

In the mounting board 1 according to Appendix 12, at least two through-holes 6A of the printed board 3 are provided with the die 44 interposed therebetween.

Accordingly, at least two board through-holes 6A are disposed sufficiently apart from each other, so that both the two board through-holes 6A can be prevented from being blocked by the resin 4 used for the sidefill.

APPENDIX 14

In the mounting board 1 according to Appendix 10, the distance d1 between the through-hole 6A of the printed board 3 and an outer periphery of the BGA 2B is longer than a distance d2 between a lower surface of the BGA 2B and an upper surface of the printed board 3.

Accordingly, the resin 4 used for the sidefill that has entered the under-component space 5 does not reach the board through-hole 6A. Accordingly, it is possible to prevent the board through-hole 6A from being blocked by the resin 4 used for the sidefill.

Although the embodiment has been described above with reference to the accompanying drawings, the present disclosure is not limited thereto. It is apparent to those skilled in the art that various modifications, corrections, substitutions, additions, deletions, and equivalents can be conceived within the scope described in the claims, and it is understood that such modifications, corrections, substitutions, additions, deletions, and equivalents also fall within the technical scope of the present disclosure. In addition, constituent elements in the embodiment described above may be freely combined without departing from the gist of the invention.

INDUSTRIAL APPLICABILITY

The technique of the present disclosure is useful for a mounting board reinforced by a resin used for the sidefill.

What is claimed is:

1. A mounting board comprising:

a printed board;

an electronic component surface-mounted on the printed board; and a resin for a sidefill applied to an outer periphery of the electronic component, wherein at least one of the printed board and the electronic component includes a through-hole connected to a space defined by the printed board, the electronic component, and the resin for the sidefill, the electronic component is a quad flat non-leaded package (QFN), the through-hole of the printed board is provided to avoid a GND land of the QFN, and the GND land has a size that is smaller than a size of a GND terminal of the QFN joined to the GND land by solder.

2. The mounting board according to claim 1, wherein the through-hole is provided inside the outer periphery of the electronic component by a predetermined distance or more.

3. The mounting board according to claim 1, wherein the through-hole is provided in each of the printed board and the electronic component.

4. The mounting board according to claim 3, wherein the through-hole of the printed board and the through-hole of the electronic component are provided at different positions in a plane view.

5. The mounting board according to claim 1, wherein the through-hole of the printed board includes at least two through-holes, and the at least two through-holes are provided to interpose the GND land between the two through-holes.

6. The mounting board according to claim 1, wherein the through-hole of the printed board are provided between a plurality of divided GND lands obtained by dividing the GND land.

7. The mounting board according to claim 1, wherein an outer periphery of the solder that joins the GND land to the GND terminal is surrounded with the resin.

8. The mounting board according to claim 1, wherein the electronic component is a ball grid array (BGA), and the through-hole of the printed board is provided to avoid a plurality of solder balls disposed in the BGA.

9. The mounting board according to claim 8, wherein the solder ball is not provided at a position of a center of a die disposed on the BGA, and the through-hole of the printed board is provided at a position of the center of the die where the solder ball is not provided.

10. The mounting board according to claim 8, wherein the solder ball is not provided at a position of a corner of a die disposed in the BGA outside the die, and the through-hole of the printed board is provided at a position of the corner of the die outside the die where the solder ball is not provided.

11. The mounting board according to claim 10, wherein the through-hole of the printed board includes at least two through-holes, and the at least two through-holes are provided to interpose the die between the two through-holes.

12. The mounting board according to claim 8, wherein a distance between the through-hole of the printed board and an outer periphery of the BGA is longer than a distance between a lower surface of the BGA and an upper surface of the printed board.

* * * * *